(12) United States Patent
Inoue

(10) Patent No.: US 12,369,372 B2
(45) Date of Patent: Jul. 22, 2025

(54) SEMICONDICTOR APPARATUS WITH DIFFERENT EMITTER REGION DENSITIES

(71) Applicant: FUJI ELECTRIC CO., LTD., Kanagawa (JP)

(72) Inventor: Masanori Inoue, Ina (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 834 days.

(21) Appl. No.: 17/487,001

(22) Filed: Sep. 28, 2021

(65) Prior Publication Data

US 2022/0140082 A1 May 5, 2022

(30) Foreign Application Priority Data

Nov. 5, 2020 (JP) ................. 2020-185411

(51) Int. Cl.
  *H10D 62/00* (2025.01)
  *H01L 23/00* (2006.01)
  *H10D 62/17* (2025.01)

(52) U.S. Cl.
  CPC ........... *H10D 62/393* (2025.01); *H01L 24/49* (2013.01); *H01L 2224/49431* (2013.01)

(58) Field of Classification Search
  CPC ............... H01L 29/1095; H01L 24/49; H01L 2224/49431; H01L 29/417; H01L 2224/05624; H01L 2224/45124; H01L 29/0696; H01L 29/66333; H01L 29/7395; H01L 24/48; H01L 24/05; H01L 2224/04042; H01L 2224/4846; H01L 2224/49111; H01L 2224/49176
  USPC ....................................................... 257/140
  See application file for complete search history.

(56) References Cited

U.S. PATENT DOCUMENTS

| 2002/0020873 | A1 | 2/2002 | Klodzinski |
| 2009/0289277 | A1* | 11/2009 | Yamaguchi ......... H01L 29/7813 257/E29.066 |
| 2016/0163854 | A1* | 6/2016 | Nishimura ........... H10D 62/127 257/330 |
| 2019/0287964 | A1 | 9/2019 | Yamano |

(Continued)

FOREIGN PATENT DOCUMENTS

| JP | 2001274399 A | 10/2001 |
| JP | 2004511084 A | 4/2004 |

(Continued)

OTHER PUBLICATIONS

Office Action issued for counterpart Japanese Application No. 2020-185411, transmitted from the Japanese Patent Office on Jun. 25, 2024 (drafted on Jun. 18, 2024).

*Primary Examiner* — Mohammad M Hoque

(57) ABSTRACT

Provided is a semiconductor apparatus comprising: a semiconductor substrate; an element electrode provided above the semiconductor substrate; an element electrode pad electrically connected to the element electrode; and a wire configured to connect to the element electrode pad at a plurality of connection points, wherein the semiconductor substrate includes an emitter region of a first conductivity type arrayed in an array direction, the emitter region facing the element electrode on an upper surface of the semiconductor substrate, wherein a density of the emitter region below a connection point of any of the wires is different from a density of the emitter region below a connection point of any other of the wires.

20 Claims, 17 Drawing Sheets

(56) References Cited

U.S. PATENT DOCUMENTS

| | | | |
|---|---|---|---|
| 2019/0288071 A1 | 9/2019 | Nishiwaki | |
| 2019/0326248 A1* | 10/2019 | Hori | H01L 24/45 |
| 2022/0065918 A1* | 3/2022 | Hidaka | G01K 7/01 |

FOREIGN PATENT DOCUMENTS

| | | | |
|---|---|---|---|
| JP | 2004363327 A | 12/2004 | |
| JP | 2010004003 A | 1/2010 | |
| JP | 2010245553 A | 10/2010 | |
| JP | 2019161103 A | 9/2019 | |
| JP | 2019192764 A | 10/2019 | |
| JP | 2022038003 A | 3/2022 | |
| WO | 2018225571 A1 | 12/2018 | |

* cited by examiner

SEMICONDICTOR APPARATUS WITH DIFFERENT EMITTER REGION DENSITIES

The contents of the following Japanese patent application are incorporated herein by reference:
NO. 2020-185411 filed in JP on Nov. 5, 2020.

BACKGROUND

1. Technical Field

The present invention relates to a semiconductor apparatus.

2. Related Art

Conventionally, a semiconductor apparatus which provides a wire on an element electrode to connect an element electrode and an external electrode through the wire is known (for example, Patent Document 1).
[Patent Document 1] WO No. 2018-225571
In a semiconductor apparatus, it is preferred to improve the destructive breakdown withstand capability.

SUMMARY

To solve the above-described issue, in a first aspect of the present invention, a semiconductor apparatus is provided. The semiconductor apparatus may comprise a semiconductor substrate. The semiconductor apparatus may comprise an element electrode. The element electrode may be provided above the semiconductor substrate. The semiconductor apparatus may comprise an element electrode pad. The element electrode pad may be electrically connected to the element electrode. The semiconductor apparatus may comprise a wire. The wire may connect to the element electrode pad at a plurality of connection points. The semiconductor substrate may include an emitter region of a first conductivity type. The emitter region may face the element electrode on an upper surface of the semiconductor substrate. The emitter region may be arrayed in an array direction. A density of the emitter region below a connection point of any of the wires may be different from a density of the emitter region below a connection point of any other of the wires.

The wire may include a connection portion. The connection portion may connect to an external electrode. A density of the emitter region below a connection point of the wire may increase as a distance to the connection portion increase.

The semiconductor apparatus may comprise three or more wires. A density of the emitter region below a connection point of the wire which is sandwiched between other wires may be higher than a density of the emitter region below a connection point of at least one of the other wires.

The emitter regions in the array direction may be discretely disposed to vary a density of the emitter region.

The emitter regions in an extending direction which is perpendicular to the array direction may be discretely disposed to vary a density of the emitter region.

A density of the emitter region may be varied based on a distance between a connection point of the wire and an end of the semiconductor apparatus.

The semiconductor apparatus may comprise a plurality of gate metal layers. The plurality of gate metal layers may be provided extending in an extending direction which is perpendicular to the array direction on the upper surface of the semiconductor substrate. The semiconductor apparatus may comprise a contact region of a first conductivity type. The contact region of a first conductivity type may be provided between two of the plurality of gate metal layers. The contact regions may be discretely disposed in the extending direction.

The contact region may be sandwiched between the emitter regions in the extending direction.

The summary clause does not necessarily describe all necessary features of the embodiments of the present invention. The present invention may also be a sub-combination of the features described above.

DESCRIPTION OF EXEMPLARY EMBODIMENTS

Hereinafter, the present invention will be described by way of embodiments of the invention, but the following embodiments are not intended to limit the invention according to the claims. In addition, not all the combinations of the features explained in the embodiments are necessarily essential for the means for solving the problems of the inventions.

Figure 1:
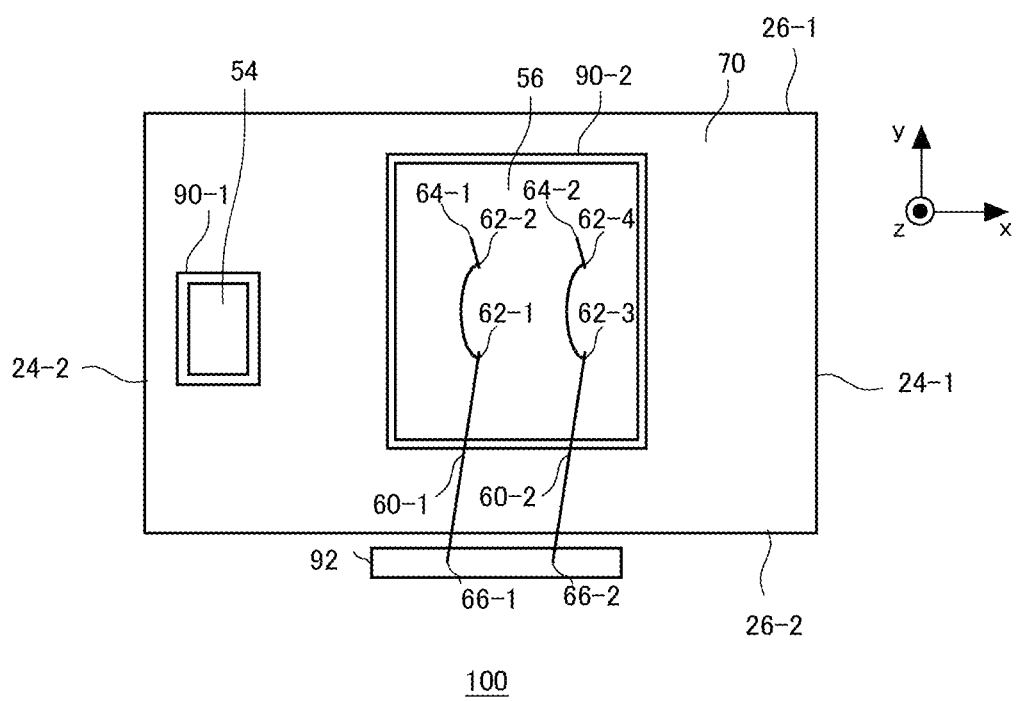
FIG. 1 shows a plan view of one example of a semiconductor apparatus 100.

FIG. 1 shows a plan view of one example of a semiconductor apparatus 100. The semiconductor apparatus 100 of this example includes a semiconductor device. The semiconductor device may be an IGBT (Insulated Gate Bipolar Transistor). The semiconductor device may be a MOSFET (Metal Oxide semiconductor field effect transistor). The semiconductor device of the semiconductor apparatus 100 of this example is the IGBT. The semiconductor apparatus 100 comprises a gate pad 54, an element electrode pad 56, a plurality of wires 60 and a protective film 70 in the plan view of FIG. 1. The semiconductor apparatus 100 is provided with a semiconductor substrate 80 having a semiconductor device (see FIG. 2). The semiconductor substrate 80 may be provided with the emitter region described below.

As used herein, the plane of the semiconductor substrate 80 on which the gate pad 54 and the element electrode pad 56 are mounted is referred to as the xy-plane and the plane perpendicular to the xy-plane is referred to as the z axis. Herein, the direction from the semiconductor substrate 80 toward the gate pad 54 and the element electrode pad 56 in the z axis direction is referred to as upper, the opposite direction is referred to as lower, but the upper and lower direction is not limited to a gravitational direction. Herein, among planes of each member, the plane on the upper side is referred to as the upper surface, and the plane on the lower side is referred to as the lower surface. Additionally, the end in the x axis direction of the semiconductor apparatus 100 is referred to as an end 24 (24-1, 24-2). The end in the y axis direction of the semiconductor apparatus 100 is referred to as an end 26 (26-1, 26-2).

The protective film 70 is provided above the semiconductor substrate 80. The protective film 70 protects the semiconductor substrate 80. The protective film 70 may be organic material. The protective film 70 is, for example, polyimide polymeric material. The protective film 70 has an aperture 90. The protective film 70 is not provided inside the aperture 90. In the example of FIG. 1, the protective film 70 has an aperture 90-1 and an aperture 90-2.

The gate pad 54 is provided above the semiconductor substrate 80. In the example of FIG. 1, the gate pad 54 is provided inside the aperture 90-1. The gate pad 54 electrically connects to the gate metal layer of the semiconductor device. The gate pad 54 applies predetermined voltage on the gate metal layer of the semiconductor device. The gate pad 54 may be metal material. The gate pad 54 is the alloy mainly composed of aluminum, for example.

The element electrode pad 56 is provided above the semiconductor substrate 80. In the example of FIG. 1, the element electrode pad 56 is provided inside the aperture 90-2. The element electrode pad 56 electrically connects to the element electrode provided on the upper surface of the semiconductor substrate 80. By way of one example, the element electrode is an emitter electrode. The element electrode pad 56 and the element electrode may be metal material. The element electrode pad 56 may be different metal material from the element electrode so as to easily connect the wire 60. The element electrode pad 56 may be the same metal material as the element electrode if there is no inconvenience to connect the wire 60. The element electrode pad 56 and the element electrode are, for example, the alloy mainly composed of aluminum.

The wire 60 connects to the element electrode pad 56 at a plurality of connection points 62. In the example of FIG. 1, a wire 60-1 connects to the element electrode pad 56 at a connection point 62-1 and a connection point 62-2. The wire 60-1 has an end 64-1 and a connection portion 66-1. The end 64-1 is the end of one side of the wire 60-1, and the connection portion 66-1 is the end of the other side of the wire 60-1. The connection portion 66-1 connects to an external electrode 92. The connection point 62-1 is the connection point on the connection portion 66-1 side on the wire 60-1, and the connection point 62-2 is the connection point on the end 64-1 side on the wire 60-1. As used herein, the connection portion 66-1 side indicates that the distance to the connection portion 66-1 is smaller than that to the end 64-1. The distance is not a spatially straight-line distance but the electrical path length along the wire 60-1.

In the example of FIG. 1, a wire 60-2 connects to the element electrode pad 56 at a connection point 62-3 and a connection point 62-4. The wire 60-2 has an end 64-2 and an connection portion 66-2. The end 64-2 is the end of one side of the wire 60-2, and the connection portion 66-2 is the end of the other side of the wire 60-2. The connection portion 66-2 connects to the external electrode 92. The connection point 62-3 is the connection point on the connection portion 66-2 side on the wire 60-2, the connection point 62-4 is the connection point on the end 64-2 side on the wire 60-2. As used herein, the connection portion 66-2 side indicates that the distance to the connection portion 66-2 is smaller than the distance to the end 64-2. The distance is not a spatially straight-line distance but the electrical path length along the wire 60-2.

Predetermined voltage is applied on the element electrode pad 56 via the wire 60-1 and the wire 60-2 from the external electrode 92. In this example, the wire 60-1 connects to the element electrode pad 56 at the connection point 62-1 and the connection point 62-2. The wire 60-2 also connects to the element electrode pad 56 at the connection point 62-3 and the connection point 62-4. Thus, the current concentration can be relaxed when compared to the case of having one connection point. Although FIG. 1 shows two wires, the semiconductor apparatus 100 may have more wires 60.

The connection point 62-1 and the connection point 62-3 are provided on the connection portion 66 side. Accordingly, because current flowing through the connection point 62-2 and the connection point 62-4 respectively flow via the connection point 62-1 and the connection point 62-3, current is more likely to concentrate and the temperature is more likely to be high at the connection point 62-1 and the connection point 62-3, when compared to the connection point 62-2 and the connection point 62-4. Thus, the destruction resulting from the rise in the temperature is likely to occur at the connection point 62-1 and the connection point 62-3.

In this example, the density of the emitter region below any connection point 62 of the wire 60 is different from the density of the emitter region below any other connection point 62 of the wire 60. It means that the density of the emitter region below the connection points 62 of the wire 60 is set different for every connection point 62. For example, the density of the emitter region below the connection point 62 where current concentrates is set low. The density of the emitter region will be described below. By setting densities of the emitter regions different, the density of the emitter region at the connection point 62-1 and connection point 62-3, where current is likely to concentrate, can be set low. Accordingly, it can improve the destructive breakdown withstand capability (e.g., FBSOA withstand capability) resulting from the rise in the temperature.

In the semiconductor apparatus 100, the density of the emitter region below the connection point 62 of the wire 60 may increase as the distance to the connection portion 66 increases. The distance to the connection portion 66 is not a spatially straight-line distance to the connection portion 66 but the electrical path length along the wire 60. The density of the emitter region below the connection point 62-2 may be higher than the density of the emitter region below the connection point 62-1. The density of the emitter region below the connection point 62-4 may be higher than the density of the emitter region below the connection point 62-3. As the distance to the connection portion 66 increases, current becomes less likely to concentrate. Accordingly, by increasing the density of the emitter region at the connection point 62 of the wire 60 as the distance to the connection portion 66 increases, the current concentration can be suppressed.

The density of the emitter region may also be varied based on the distance between the connection point 62 of the wire 60 and the end of the semiconductor apparatus 100. The density of the emitter region may be varied based on the distance between the connection point 62 of the wire 60 and the end 24-1 of the semiconductor apparatus 100. The density of the emitter region may be varied based on the distance between the connection point 62 of the wire 60 and the end 24-2 of the semiconductor apparatus 100. The density of the emitter region may be varied based on the distance between the connection point 62 of the wire 60 and the end 26-1 of the semiconductor apparatus 100. The density of the emitter region may be varied based on the distance between the connection point 62 of the wire 60 and the end 26-2 of the semiconductor apparatus 100. The distance between the connection point 62 and the end of the semiconductor apparatus 100 may the spatially shortest distance between the connection point 62 and the end of the semiconductor apparatus 100. The distance between the connection point 62 and the end of the semiconductor apparatus 100 is the distance in the direction where there is no other connection points 62. For example, if the connection point 62-1 and the connection point 62-2 are disposed side by side as shown in FIG. 1, the distance between the connection point 62-1 and the end of the semiconductor apparatus 100 is the distance between the connection point 62-1 and the end 26-2. Similarly, the distance between the connection point 62-2 and the end of the semiconductor apparatus 100 is the distance between the connection point 62-2 and the end 26-1. For example, the density of the emitter region below the connection point 62 of the wire 60 is set lower as the distance between the connection point 62 of the wire 60 and the end of the semiconductor apparatus 100 increases. As the distance of the connection point 62 to the end of the semiconductor apparatus 100 increases, current flows from a larger region, and the flowing current is more likely to concentrate. Therefore, by varying the density of the emitter region based on the distance between the connection point 62 of the wire 60 and the end of the semiconductor apparatus 100, the current concentration can also be suppressed.

Figure 2:
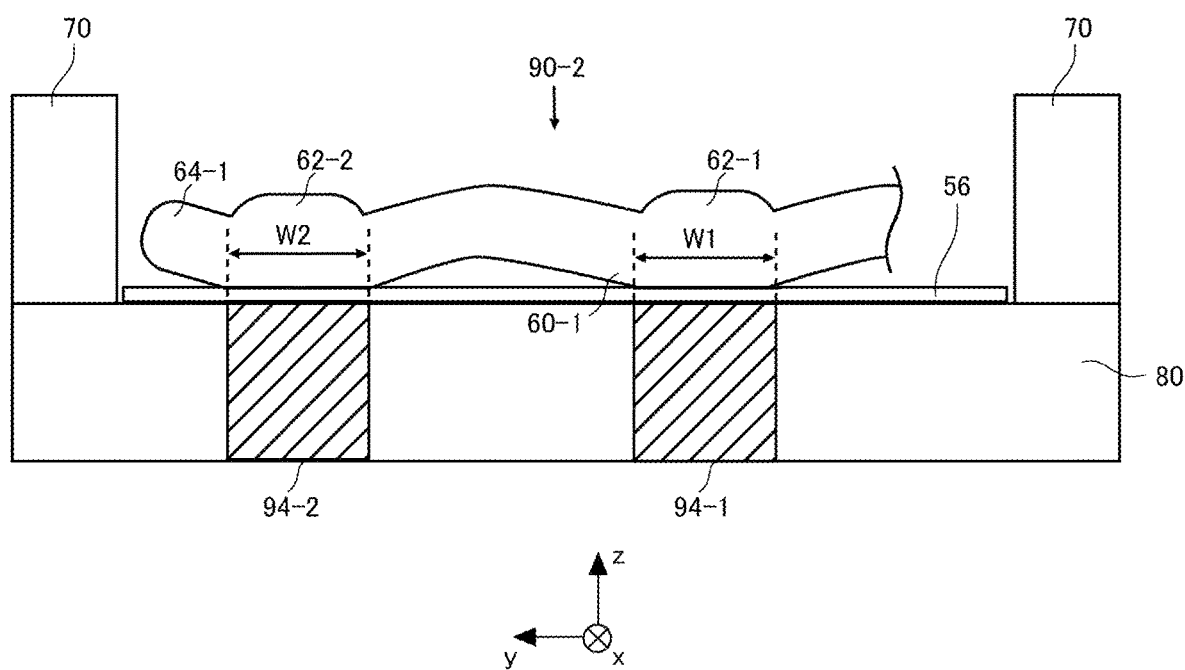
FIG. 2 shows a connection point 62 of a wire 60.

FIG. 2 shows the connection point 62 of the wire 60. FIG. 2 schematically shows the connection point 62-1 and connection point 62-2 of the wire 60-1. In FIG. 2, the element electrode and the gate metal layer and the like, which are disposed between the element electrode pad 56 and the semiconductor substrate 80, are omitted. The wire 60-1 is provided at an aperture 90-2 of the protective film 70. The wire 60 may be joined to the element electrode pad 56 by being pushed against the element electrode pad 56 at the connection point 62. When joining the wire 60, ultrasound may be applied to the connection point 62, and the connection point 62 may also be heated. The wire 60 may be joined to the element electrode pad 56 by conductive material such as solder. In this case, the connection point 62 is a portion including conductive material such as solder. The wire 60 may be metal material. For the wire 60, material appropriate for the way of joining it to the element electrode pad 56 may be used. When joining the wire 60 to the element electrode pad 56, if the element electrode pad 56 is the alloy mainly composed of aluminum, and if ultrasonic is applied to the connection point 62, and further the connection point 62 is heated, the material of the wire 60 may be aluminum, for example. The diameter of the wire 60 may be appropriately selected in accordance with the flowing current. For example, the diameter of the wire 60 is the size ranging from 300 μm to 700 μm.

As shown in FIG. 2, the connection point 62 having a width is provided. In the example of FIG. 2, the connection point 62-1 has a width W1. In other words, the connection point 62-1 connects to the element electrode pad 56 at the length of the width W1. The connection point 62-2 has a width W2. In other words, the connection point 62-2 connects to the element electrode pad 56 at the length of the width W2. The region below the connection point 62 is referred to as a region 94. In FIG. 2, the region 94 is indicated by hatching. The region below the connection point 62-1 is a region 94-1. The region 94-1 also has the width W1. The region below the connection point 62-2 is a region 94-2. The region 94-2 also has the width W2. By setting the density of the emitter region disposed in the region 94-1 different from the density of the emitter region disposed in the region 94-2, the destructive breakdown withstand capability resulting from the rise in the temperature can be improved.

Figure 3:
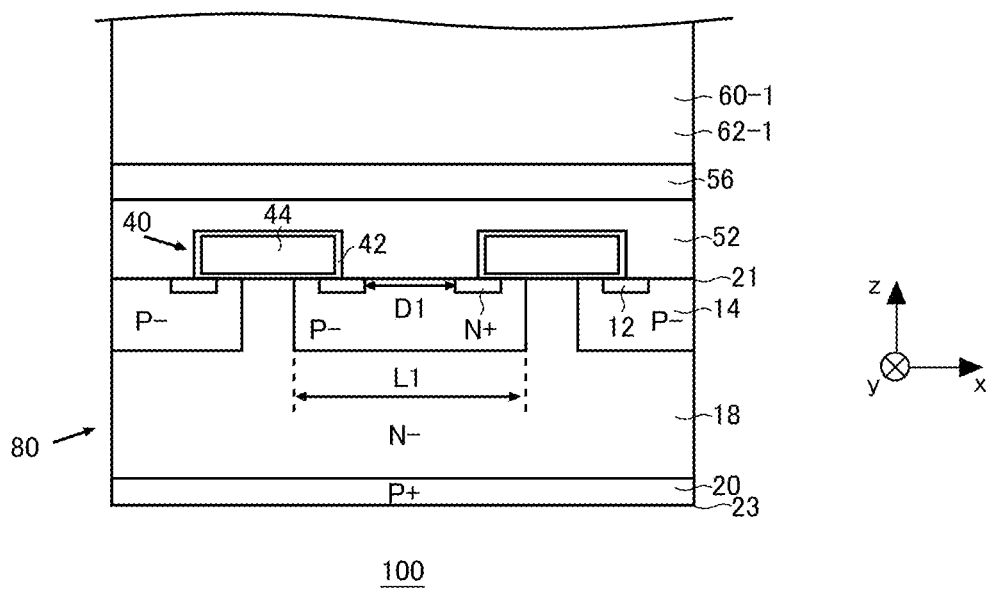
FIG. 3 shows one example of the configuration of the semiconductor apparatus 100 in a region 94-1.

FIG. 3 shows one example of the configuration of the semiconductor apparatus 100 in the region 94-1. The semiconductor apparatus 100 in FIG. 3 is the planer gate type IGBT provided with a gate metal layer 40 on an upper surface 21 of the semiconductor substrate 80. The semiconductor apparatus 100 may be the trench gate type IGBT where the gate metal layer 40 is embedded in the trench. In the example of FIG. 3, the semiconductor apparatus 100 comprises the gate metal layer 40, an element electrode 52, the element electrode pad 56, the wire 60-1, and the semiconductor substrate 80.

The semiconductor substrate 80 includes an emitter region 12, an base region 14, a drift region 18, and a collector region 20. The base region 14 is selectively formed on the upper surface 21 of the semiconductor substrate 80. The drift region 18 is provided between the base region 14 and a lower surface 23 of the semiconductor substrate 80. The drift region 18 of this example is of a first conductivity type, and the base region 14 is of a second conductivity type. When explaining in this example, the first conductivity type is used as an N type, and the second conductivity type is used as a P type. However, the first conductivity type may be used as the P type, and the second conductivity type may be used as the N type. The drift region 18 of this example is of an N⁻-type, and the base region 14 is of a P⁻-type.

The emitter region 12 of the first conductivity type, where the impurity crowding is higher than that of the drift region 18, is formed on the upper surface 21 of the semiconductor substrate 80. The emitter region 12 of this example is of an N⁺-type. In the example of FIG. 3, a plurality of emitter regions 12 is discretely arrayed in the array direction (the x axis direction). Although the example of FIG. 3 shows an example of the array direction of the emitter region 12 (the x axis direction) being orthogonal to the extending direction of the wire 60-1 (the y axis direction) shown in FIG. 2, the array direction of the emitter region 12 is not limited to the x axis direction. The array direction of the emitter region 12 may have any angle to the extending direction of the wire. The emitter region 12 faces the element electrode 52, on the upper surface 21 of the semiconductor substrate 80. Additionally, a collector region 20 of the second conductivity type is formed on the lower surface 23 of the semiconductor substrate 80, wherein the impurity crowding is higher than the base region 14. The collector region 20 of this example is of a P⁺-type. In addition, the collector metal layer (not illustrated) which faces the collector region 20 on the lower surface 23 of the semiconductor substrate 80 is provided in the semiconductor apparatus 100.

The gate metal layer 40 is provided on the upper surface 21 of the semiconductor substrate 80. Also, the gate metal layer 40 extends in the extending direction perpendicular to the array direction. The gate metal layer 40 has a dielectric film 42 and a gate conductive portion 44. The dielectric film 42 may be formed by oxidizing or nitriding the semiconductor. The gate conductive portion 44 is formed on the inner side than the dielectric film 42. Therefore, the dielectric film 42 insulates the gate conductive portion 44 from the semiconductor substrate 80. For example, the gate conductive portion 44 is formed of conductive material such as polysilicon.

The gate conductive portion 44 includes at least a region facing the base region 14. The gate conductive portion 44 of this example is disposed facing the base region 14, which is in between the emitter region 12 and the drift region 18, on the upper surface 21 of the semiconductor substrate 80. Each gate conductive portion 44 is electrically connected to the gate pad 54. If a predetermined voltage is applied to the gate metal layer 40 via the gate pad 54, a channel is formed on the outer layer of the base region 14 facing the gate metal layer 40. Additionally, at least a part of the emitter region 12 may be provided facing the gate conductive portion 44. In the example of FIG. 3, at least a part of the emitter region 12 faces the dielectric film 42 of the gate metal layer 40.

The element electrode 52 is provided above the semiconductor substrate 80. In the example of FIG. 3, the element electrode 52 is provided on the upper surface 21 of the semiconductor substrate 80. The element electrode 52 may be provided through a barrier layer on the upper surface 21 of the semiconductor substrate 80. The element electrode 52 faces the emitter region 12 and the base region 14, on the upper surface 21 of the semiconductor substrate 80. Also, the element electrode 52 and the gate conductive portion 44 are insulated by the dielectric film 42.

In the example of FIG. 3, the element electrode pad 56 and the wire 60 (the wire 60-1) are provided above the element electrode 52. The wire 60-1 connects to the element electrode pad 56 at the connection point 62-1.

In this example, by discretely disposing emitter regions 12 in the array direction, the density of the emitter region 12 is varied. In this example, the distance D1 between the emitter regions 12 in the array direction is varied. Alternately, the width L1 of the base region 14 in the array direction may be varied. As the distance D1 between the emitter regions 12 in the array direction increases, the current concentration is reduced, and the rise in the temperature can be suppressed.

Figure 4:
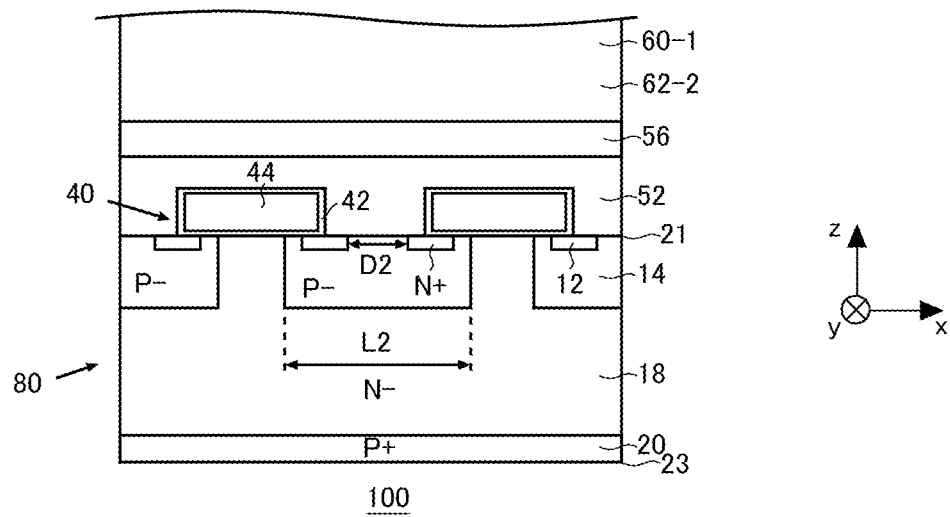
FIG. 4 shows one example of the configuration of the semiconductor apparatus 100 in a region 94-2.

FIG. 4 shows one example of the configuration of the semiconductor apparatus 100 in the region 94-2. The region 94-2 is different from the structure shown in FIG. 3 in that the wire 60-1 connects to the element electrode pad 56 at the connection point 62-2. In addition, the region 94-2 is different from the structure shown FIG. 3 in that the distance between the emitter regions 12 is D2, the width of the base region 14 is L2. Other configurations in the region 94-2 than the above-described ones may be identical with those in the region 94-1 shown in FIG. 3.

The distance D2 between the emitter regions 12 in the region 94-2 is different from the distance D1 between the emitter regions 12 in the region 94-1. Accordingly, the density of the emitter region 12 below the connection point 62 of the wire 60 can be made different at every connection point 62. In examples of FIG. 3 and FIG. 4, D1>D2. In other words, the density of the emitter region 12 in the region 94-2 is higher than the density of the emitter region 12 in the region 94-1.

Figure 5:
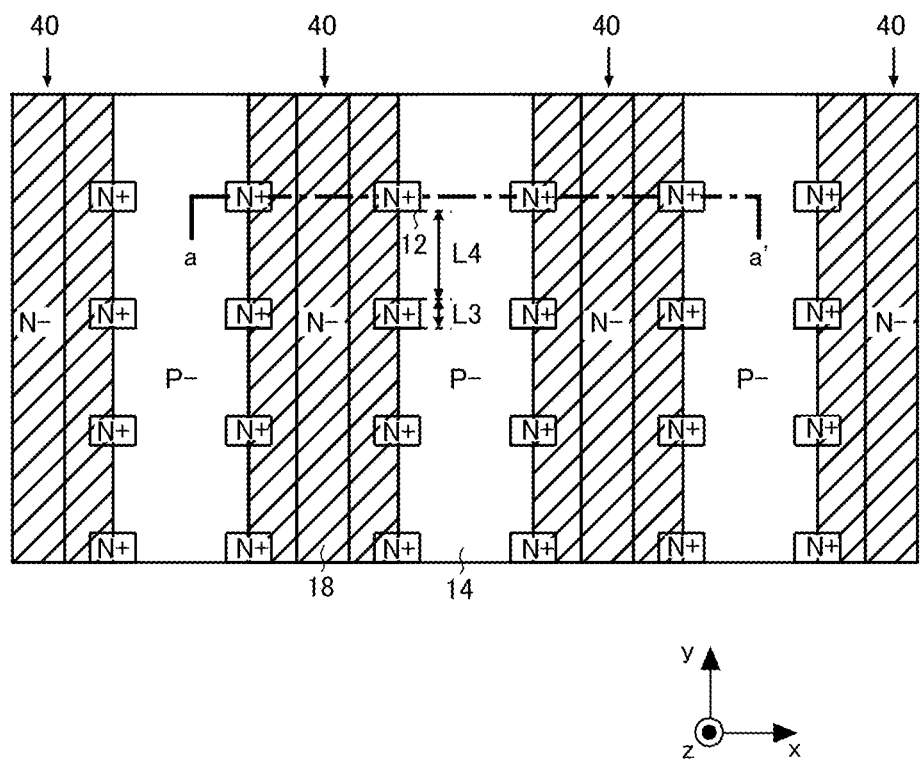
FIG. 5 is a figure for explaining one example of the placement of an emitter region 12 in a plan view.

FIG. 5 shows a figure for explaining one example of the placement of the emitter region 12 in a plan view. FIG. 3 or FIG. 4 is one example of the cross section a-a' in FIG. 5. FIG. 5 shows the emitter region 12, the base region 14, and the drift region 18, on the upper surface 21 of the semiconductor substrate 80. The gate metal layer 40 is indicated by hatching.

In this example, by discretely disposing the emitter regions 12 in the array direction as well as discretely disposing the emitter regions 12 in the extending direction, the density of the emitter region 12 is varied. In the example of FIG. 5, the extending direction is the y axis direction.

In the example of FIG. 5, the width of the emitter region 12 in the extending direction is referred to as L3, and the space between emitter regions 12 in the extending direction is referred to as L4. L4 may be larger than L3. By way of one example, L3:L4=1:3. By adjusting the ratio of L3 to L4, the current concentration can be reduced, and the rise in the temperature can be suppressed. To reduce the density of the emitter region 12, the ratio of L3 to L4 may be made smaller. To increase the density of the emitter region 12, the ratio of L4 to L3 may be made larger.

Figure 6:
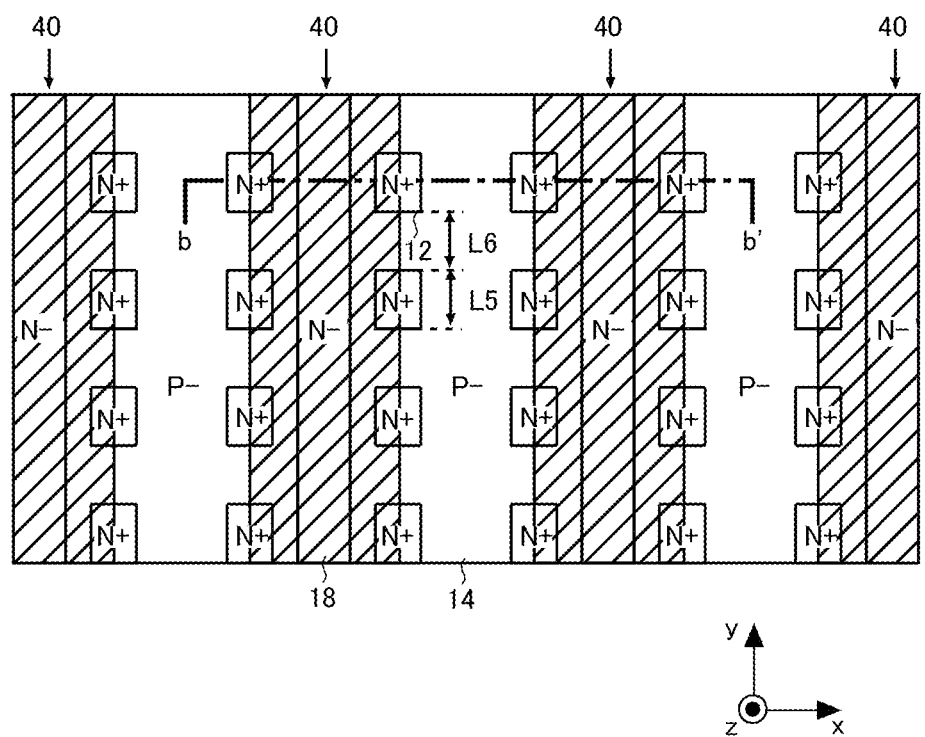
FIG. 6 is a figure for explaining another example of the placement of the emitter region 12 in a plan view.

FIG. 6 is a figure for explaining another example of the placement of the emitter region 12 in a plan view. FIG. 3 or FIG. 4 is one example of the cross section b-b' in FIG. 6. FIG. 6 is different from FIG. 5. in that the width of the emitter region 12 in the extending direction is L5, and the space between the emitter regions 12 in the extending direction is L6. Other configurations of FIG. 6 may be identical with FIG. 5.

In the example of FIG. 6, L6 may be identical with L5. A case of having an error less than ±10% may be regarded as identical. In the example of FIG. 6, because the ratio of L5 to L6 is larger when compared to the example of FIG. 5, the density of the emitter region 12 is higher than the example of FIG. 5. As shown in FIG. 5 and FIG. 6, by adjusting the ratio between L5 and L6, the current concentration can be reduced, and the rise in the temperature can be suppressed. Note that, the width of the emitter region 12 in the extending direction may be larger than the space between the emitter regions 12 in the extending direction.

Although it is explained that FIG. 3 or FIG. 4 is one example of the cross section in FIG. 5 and FIG. 6, the ratio between the width and space of the emitter regions 12 may be varied at every connection point 62. For example, in the region 94-1, the emitter region 12 may be disposed with L3:L4=1:3 as in FIG. 5, and in the region 94-2, the emitter region 12 may be disposed with L5:L6=1:1 as in FIG. 6. In this manner, by varying the ratio between the width and space of the emitter regions 12 at every connection point 62, the density of the emitter region 12 in the extending direction can be varied at every connection point 62.

Figure 7:
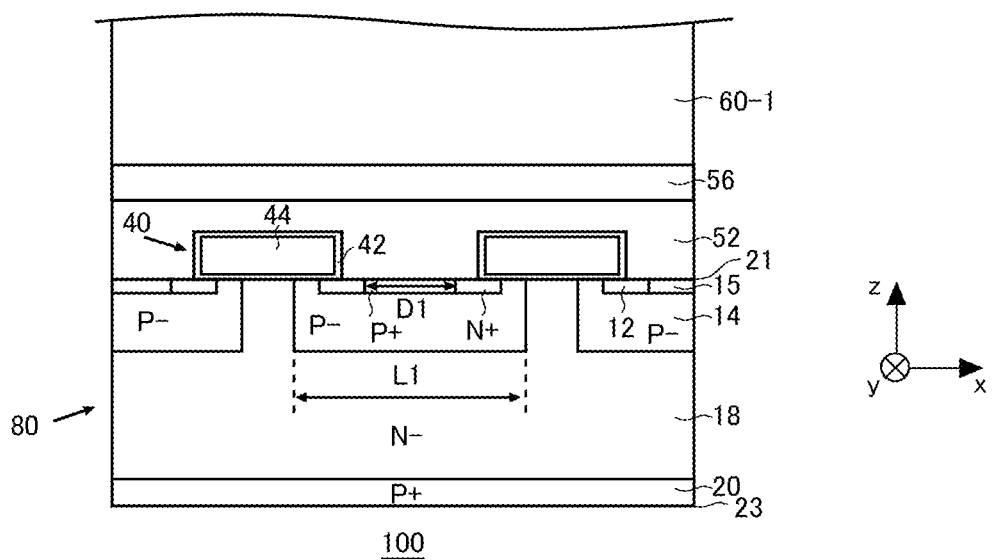
FIG. 7 shows another example of the configuration of the semiconductor apparatus 100 in the region 94-1.

FIG. 7 shows another example of the configuration of the semiconductor apparatus 100 in the region 94-1. The semiconductor apparatus 100 of FIG. 7 is different from the semiconductor apparatus 100 of FIG. 3 in that it comprises a contact region 15 on the upper surface 21 of the semiconductor substrate 80. Other configurations of FIG. 7 may be identical with FIG. 3.

The contact region 15 is provided between two gate metal layers 40 on the upper surface 21 of the semiconductor substrate 80. The contact region 15 may be provided between the emitter regions 12. Thus, in this example, the contact region 15 does not face the gate metal layer 40. The contact region 15 connects to the element electrode 52. The contact region 15 of this example is of the second conductivity type, wherein the impurity crowding is higher than the base region 14. The contact region 15 of this example is the P$^+$-type. In addition, the distance D1 between the emitter regions 12 in the array direction is the same as the width of the contact region 15 in the array direction.

Figure 8:
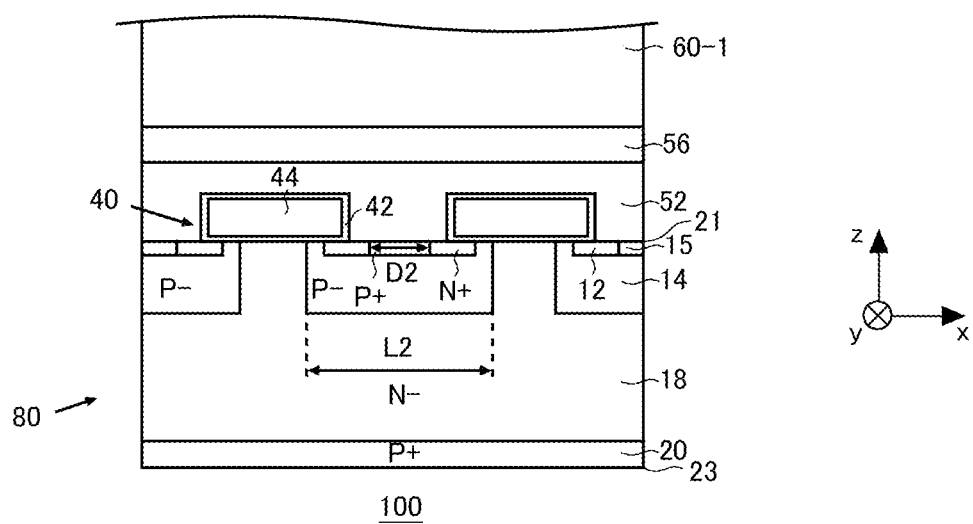
FIG. 8 shows another example of the configuration of the semiconductor apparatus 100 in the region 94-2.

FIG. 8 shows another example of the configuration of the semiconductor apparatus 100 in the region 94-2. The semiconductor apparatus 100 of FIG. 8 is different from the semiconductor apparatus 100 of FIG. 4 in that it comprises the contact region 15 on the upper surface 21 of the semiconductor substrate 80. Other configurations of FIG. 8 may be identical with FIG. 4. The distance D2 between the emitter regions 12 in the array direction is the same as the width of the contact region 15 in the array direction.

As with FIG. 3 and FIG. 4, the distance D2 between the emitter regions 12 in the region 94-2 is different from the distance D1 between the emitter regions 12 in the region 94-1. Accordingly, the density of the emitter regions 12 below the connection points 62 of the wire 60 can be made different at every connection point 62. In the examples of FIG. 8 and FIG. 7, D1>D2.

Figure 9:
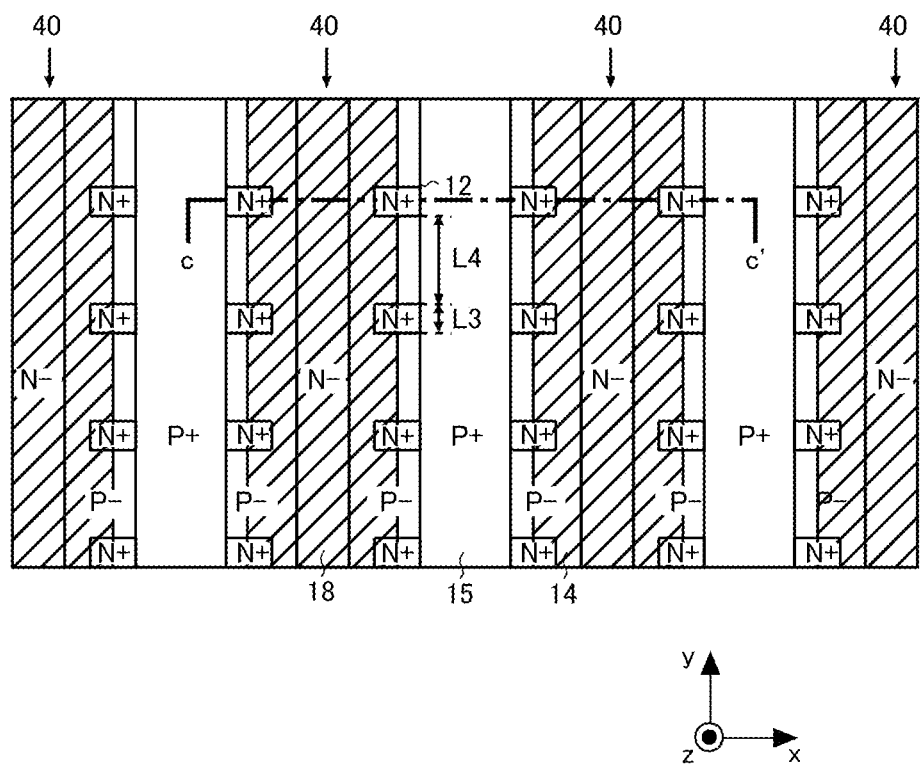
FIG. 9 is a figure for explaining another example of the placement of the emitter region 12 in a plan view.

FIG. 9 is a figure for explaining another example of the placement of the emitter region 12 in a plan view. FIG. 7 or FIG. 8 is one example of the cross section c-c' in FIG. 9. FIG. 9 is different from FIG. 5 in that it comprises the contact region 15. Other configurations of FIG. 9 may be identical with FIG. 5. Even when it comprises the contact region 15, by adjusting the ratio between L3 and L4, the current concentration can be reduced, and the rise in the temperature can be suppressed.

Figure 10:
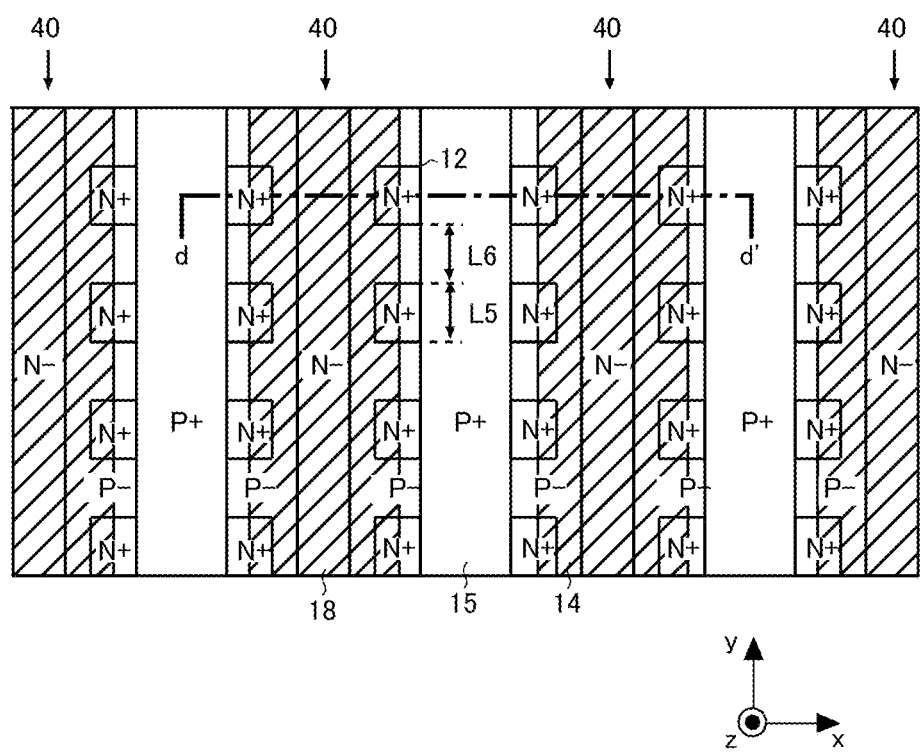
FIG. 10 is a figure for explaining another example of the placement of the emitter region 12 in a plan view.

FIG. 10 is a figure for explaining another example of the placement of the emitter region 12 in a plan view. FIG. 7 or FIG. 8 is one example of the cross section d-d' in FIG. 10. FIG. 10 is different from FIG. 6 in that it comprises the contact region 15. Other configurations of FIG. 10 may be identical with FIG. 6. Even when comprising the contact region 15, by adjusting the ratio between L5 and L6, the current concentration can be reduced, and the rise in the temperature can be suppressed.

Figure 11:
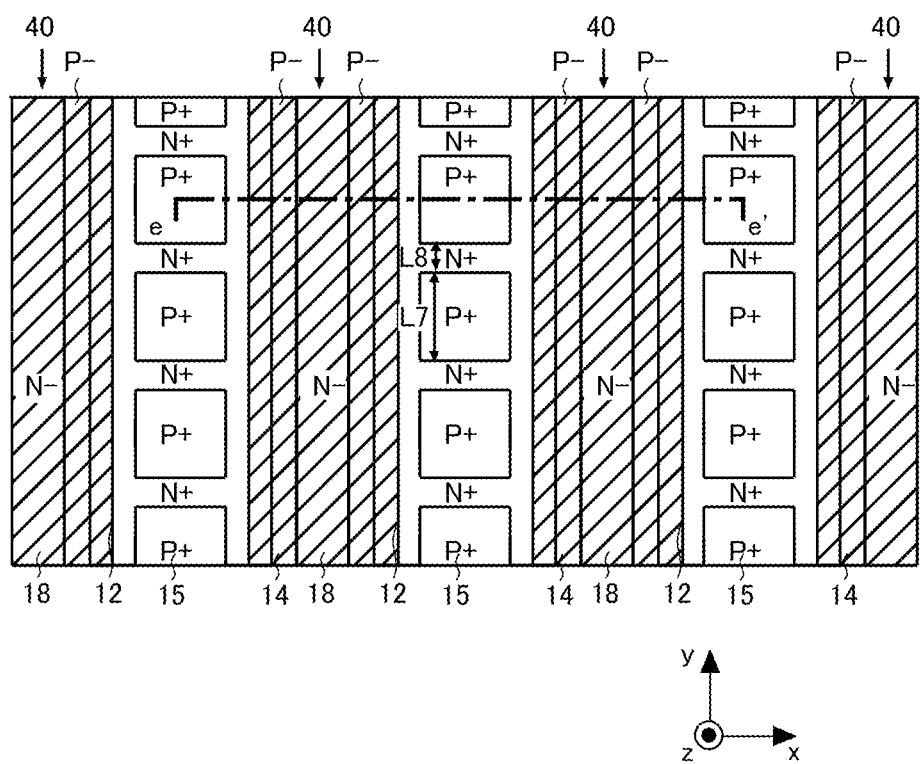
FIG. 11 is a figure for explaining another example of the placement of the emitter region 12 in a plan view.

FIG. 11 is a figure for explaining another example of the placement of the emitter region 12 in a plan view. FIG. 7 or FIG. 8 is one example of the cross section e-e' in FIG. 11. FIG. 11 is different from FIG. 9 and FIG. 10 in that the contact regions 15 are discretely provided in the extending direction. Other configurations of FIG. 11 may be identical with FIG. 9 and FIG. 10. Note that, the emitter region 12 is provided between the contact regions 15 in the extending direction. In other words, the contact region 15 is sandwiched by the emitter regions 12 in the extending direction. In the example of FIG. 11, the emitter region 12 is provided in a ladder shape.

In the example of FIG. 11, the width of the contact region 15 in the extending direction is referred to as L7, and the space between the contact regions 15 in the extending direction is referred to as L8. The ratio of L7 to L8 may be large. By way of one example, L7:L8=3:1. By adjusting the ratio between L7 and L8, the density of the emitter region 12 can be varied.

Figure 12:
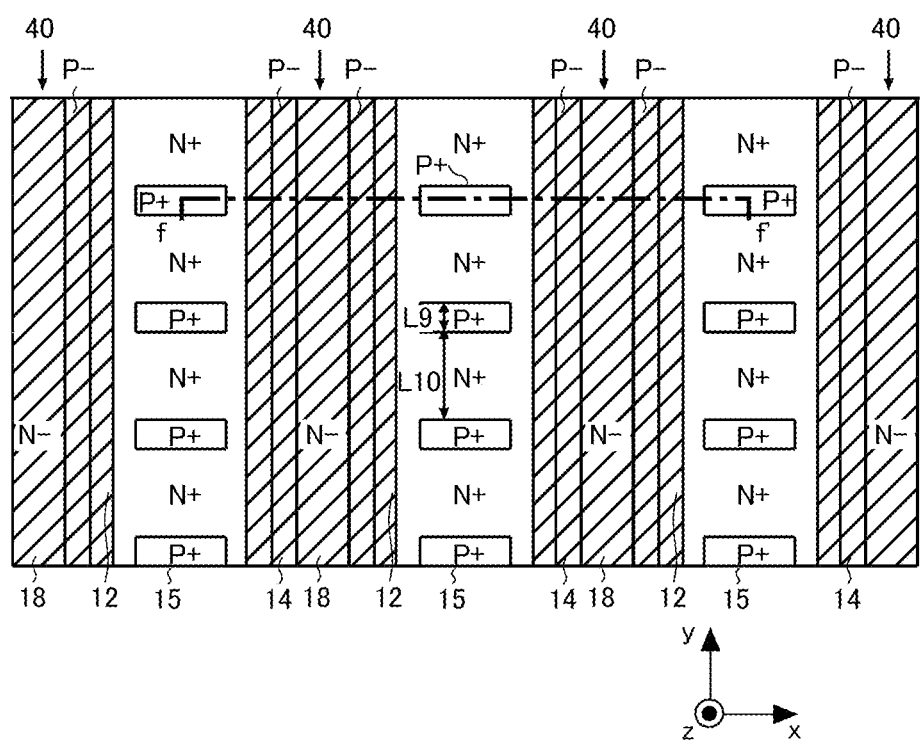
FIG. 12 is a figure for explaining another example of the placement of the emitter region 12 in a plan view.

FIG. 12 is a figure for explaining another example of the placement of the emitter region 12 in a plan view. FIG. 7 or FIG. 8 is one example of the cross section f-f' in FIG. 12. FIG. 12 is different from FIG. 9 and FIG. 10 in that the contact region 15 is discretely provided in the extending direction. Other configurations of FIG. 12 may be identical with FIG. 9 and FIG. 10. Note that, the emitter region 12 is provided between the contact regions 15 in the extending direction. In the example of FIG. 12, the emitter region 12 is provided in a ladder shape.

In the example of FIG. 12, the width of the contact region 15 in the extending direction is referred to as L9, the space between the contact regions 15 in the extending direction is referred to as L10. The ratio of L9 to L10 may be small. By way of one example, L9:L10=1:3. By adjusting the ratio between L9 and L10, the density of the emitter region 12 can be varied. FIG. 11 and FIG. 12 are effective for miniaturizing the semiconductor apparatus 100 because they can manufacture the width between the gate metal layers 40 narrower than FIG. 9 and FIG. 10.

Figure 13:
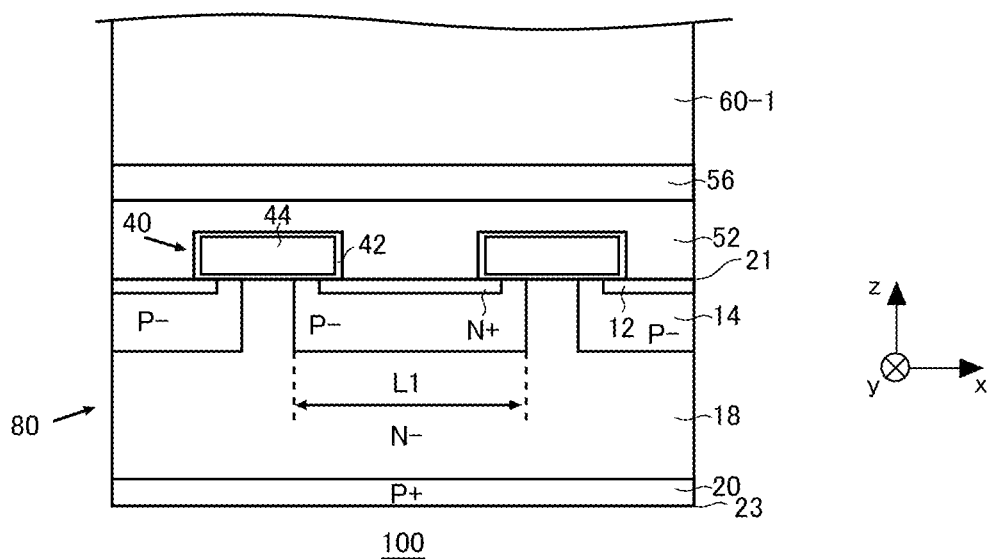
FIG. 13 shows another example of the configuration of the semiconductor apparatus 100 in the region 94-1.

FIG. 13 shows another example of the configuration of the semiconductor apparatus 100 in the region 94-1. The semiconductor apparatus 100 of FIG. 13 is different from the semiconductor apparatus 100 of FIG. 7 in that it comprises the emitter region 12 instead of the contact region 15 on the upper surface 21 of the semiconductor substrate 80. Other configurations of FIG. 13 may be identical with FIG. 7.

Figure 14:
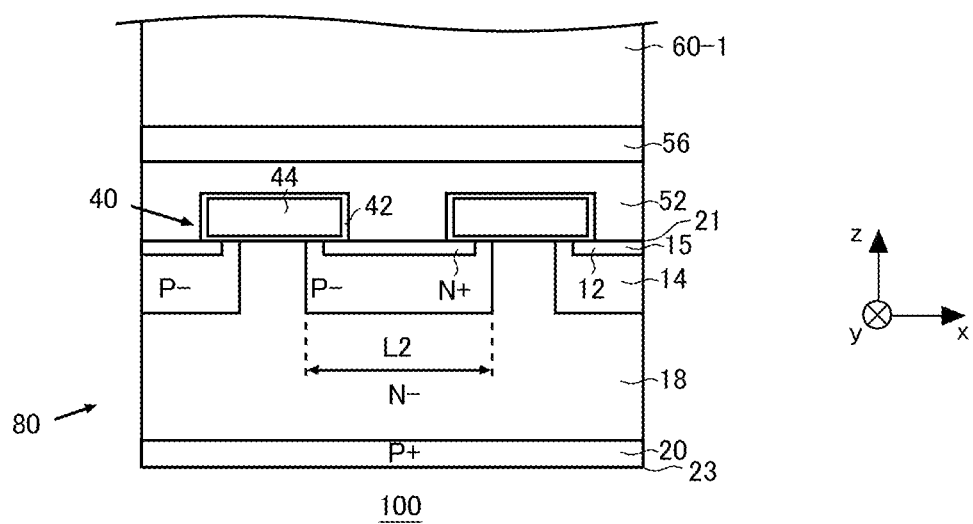
FIG. 14 shows another example of the configuration of the semiconductor apparatus 100 in the region 94-2.

FIG. 14 shows another example of the configuration of the semiconductor apparatus 100 in the region 94-2. The semiconductor apparatus 100 of FIG. 14 is different from the semiconductor apparatus 100 of FIG. 8 in that it comprises the emitter region 12 instead of the contact region 15 on the upper surface 21 of the semiconductor substrate 80. Other configurations of FIG. 14 may be identical with FIG. 8. In FIG. 13 and FIG. 14, the emitter region 12 is consecutively provided between two gate metal layers 40 on the upper surface 21 of the semiconductor substrate 80.

Figure 15:
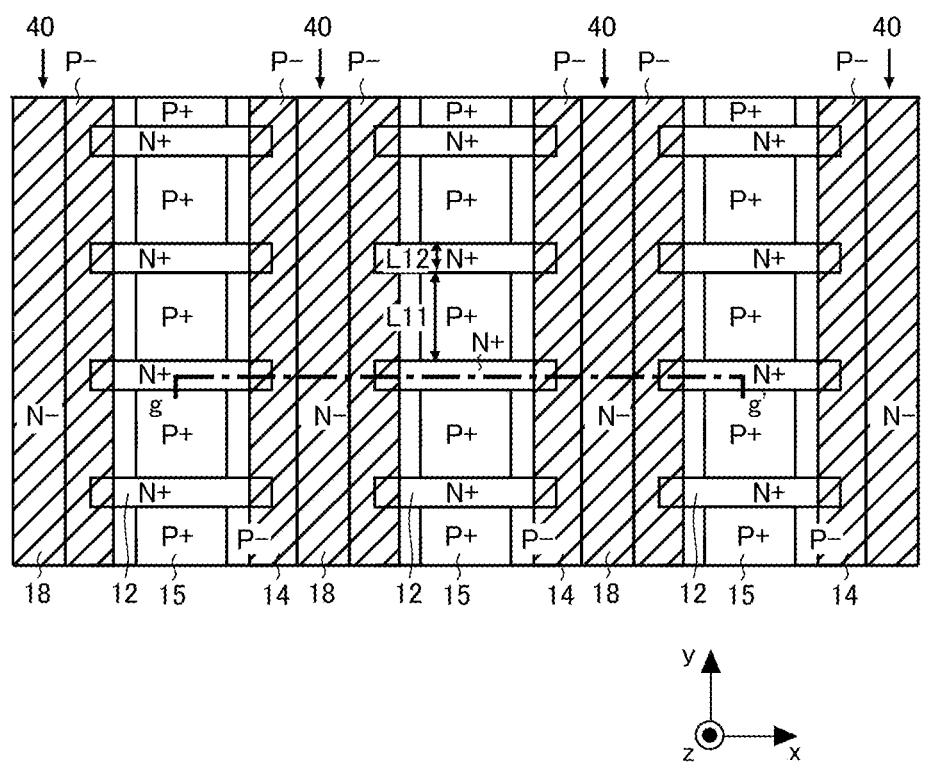
FIG. 15 is a figure for explaining another example of the placement of the emitter region 12 in a plan view.

FIG. 15 is a figure for explaining another example of the placement of the emitter region 12 in a plan view. FIG. 13 or FIG. 14 is one example of the cross section g-g' of FIG. 15. FIG. 15 is different form FIG. 9 and FIG. 10 in that the emitter region 12 is consecutively provided between two gate metal layers 40. Other configurations of FIG. 15 may be identical with FIG. 9 and FIG. 10. Even when the emitter region 12 is consecutively provided between two gate metal layers 40, by adjusting the ratio between L11 and L12, the current concentration can be reduced, and the rise in the temperature can be suppressed.

Figure 16:
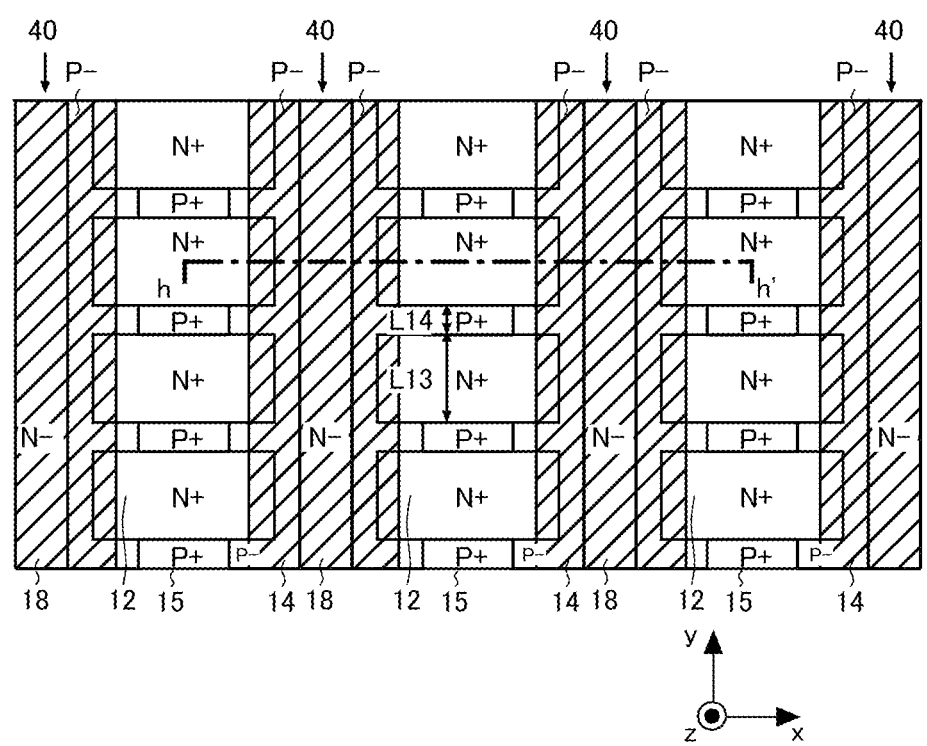
FIG. 16 is a figure for explaining another example of the placement of the emitter region 12 in a plan view.

FIG. 16 is a figure for explaining another example of the placement of the emitter region 12 in a plan view. FIG. 13 or FIG. 14 is one example of the cross section h-h' in FIG. 16. FIG. 16 is different from FIG. 9 and FIG. 10 in that the emitter region 12 is consecutively provided between two gate metal layers 40. Other configurations of FIG. 16 may be identical with FIG. 9 and FIG. 10. Even when the emitter region 12 is consecutively provided between two gate metal layers 40, by adjusting the ratio between L13 and L14, the current concentration can be reduced, and the rise in the temperature can be suppressed. In FIG. 15 and FIG. 16, the emitter regions 12 and the contact regions 15 are discretely provided in the extending direction. As with FIG. 11 and FIG. 12, FIG. 15 and FIG. 16 are effective for miniaturizing the semiconductor apparatus 100 because they can manufacture the width between gate metal layers 40 narrower than FIG. 9 and FIG. 10.

Figure 17:
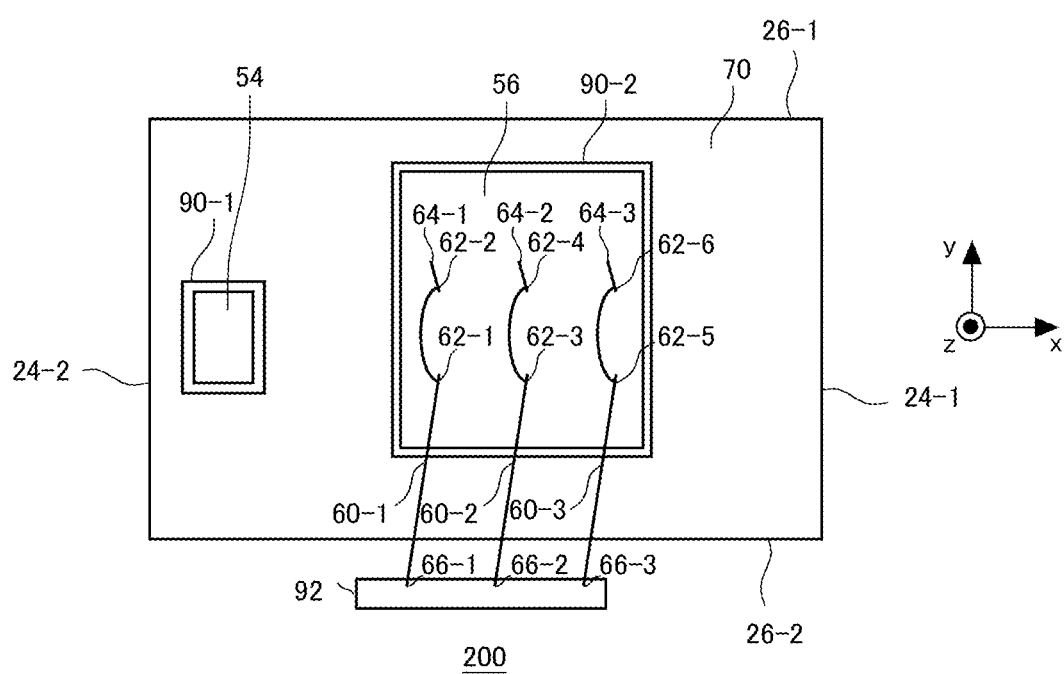
FIG. 17 shows a plan view of one example of a semiconductor apparatus 200.

FIG. 17 shows a plan view of one example of a semiconductor apparatus 200. The semiconductor apparatus 200 of FIG. 17 is different from the semiconductor apparatus 100 of FIG. 1 in that it comprises three or more wires 60. Other configurations of the semiconductor apparatus 200 of FIG. 17 may be identical with the semiconductor apparatus 100 of FIG. 1.

The semiconductor apparatus 200 comprises the wire 60-1, the wire 60-2, and a wire 60-3. In the example of FIG.

17, the wire 60-3 connects to the element electrode pad 56 at a connection point 62-5 and a connection point 62-6. The wire 60-3 has an end 64-3 and a connection portion 66-3. The end 64-3 is one end of the wire 60-3, and the connection portion 66-3 is the other end of the wire 60-3. The connection portion 66-3 connects to the external electrode 92. The connection point 62-5 is the connection point on the connection portion 66-3 side on the wire 60-3, and the connection point 62-6 is the connection point on the end 64-3 side on the wire 60-3. The wire 60-2 is sandwiched by the wire 60-1 and the wire 60-3 in the array direction.

The density of the emitter region 12 below the connection point 62 of the wire 60 sandwiched by other wires 60 may be higher than the density of the emitter region 12 below at least one of the connection points 62 of other wires 60. In other words, the density of the emitter region 12 below the connection point 62 of the wire 60-2 may be higher than the density of the emitter region 12 below at least one of the connection points 62 of the wire 60-1 and the wire 60-3. In the example of FIG. 17, the density of the emitter region 12 below the connection point 62-3 may be higher than the density of the emitter region 12 below the connection point 62-1. Also, the density of the emitter region 12 below the connection point 62-3 may be higher than the density of the emitter region 12 below the connection point 62-5. Because current is less likely to concentrate on the wire 60-2 sandwiched by the other wire 60-1 and wire 60-3, by increasing the density of the emitter region 12, the current concentration can be reduced, and the rise in the temperature can be suppressed.

Also, the density of the emitter region 12 below the connection point 62-4 may be higher than the density of the emitter region 12 below at least one of the connection points of the wire 60-1 and the wire 60-3. The density of the emitter region 12 below the connection point 62-4 may be higher than the density of the emitter region 12 below the connection point 62-2. The density of the emitter region 12 below the connection point 62-4 may be higher than the density of the emitter region 12 below the connection point 62-6. The density of the emitter region 12 below the connection point 62-4 may be higher than the density of the emitter region 12 below the connection point 62-1. The density of the emitter region 12 below the connection point 62-4 may be lower than the density of the emitter region 12 below the connection point 62-1. The density of the emitter region 12 below the connection point 62-4 may be higher than the density of the emitter region 12 below the connection point 62-5. The density of the emitter region 12 below the connection point 62-4 may be lower than the density of the emitter region 12 below the connection point 62-5.

While the embodiments of the present invention have been described, the technical scope of the invention is not limited to the above described embodiments. It is apparent to persons skilled in the art that various alterations or improvements can be added to the above-described embodiments. It is also apparent from the scope of the claims that the embodiments added with such alterations or improvements can be included in the technical scope of the present invention.

What is claimed is:

1. A semiconductor apparatus comprising:
   a semiconductor substrate:
   an element electrode provided above the semiconductor substrate;
   an element electrode pad electrically connected to the element electrode; and
   wires, wherein each wire is configured to connect to the element electrode pad at a plurality of connection points,
   wherein the semiconductor substrate includes an emitter region of a first conductivity type arrayed in an array direction, the emitter region facing the element electrode on an upper surface of the semiconductor substrate,
   wherein a density of the emitter region below a connection point of any of the wires is different from a density of the emitter region below a connection point of any other of the wires.

2. The semiconductor apparatus according to claim 1, wherein each wire includes a connection portion configured to connect to an external electrode,
   wherein a density of the emitter region below a connection point of each wire increases as a distance to the connection portion increases.

3. The semiconductor apparatus according to claim 1, comprising three or more of the wires,
   wherein a density of the emitter region below a connection point of one of the wires, which is sandwiched between other wires, is higher than a density of the emitter region below at least one connection point of the other wires.

4. The semiconductor apparatus according to claim 2, comprising three or more of the wires, wherein a density of the emitter region below a connection point of one of the wires, which is sandwiched between other wires, is higher than a density of the emitter region below at least one connection point of the other wires.

5. The semiconductor apparatus according to claim 1, wherein the emitter regions in the array direction are discretely disposed to vary a density of the emitter region.

6. The semiconductor apparatus according to claim 2, wherein the emitter regions in the array direction are discretely disposed to vary a density of the emitter region.

7. The semiconductor apparatus according to claim 3, wherein the emitter regions in the array direction are discretely disposed to vary a density of the emitter region.

8. The semiconductor apparatus according to claim 4, wherein the emitter regions in the array direction are discretely disposed to vary a density of the emitter region.

9. The semiconductor apparatus according to claim 1, wherein the emitter regions in an extending direction which is perpendicular to the array direction are discretely disposed to vary a density of the emitter region.

10. The semiconductor apparatus according to claim 2, wherein the emitter regions in an extending direction which is perpendicular to the array direction are discretely disposed to vary a density of the emitter region.

11. The semiconductor apparatus according to claim 3, wherein the emitter regions in an extending direction which is perpendicular to the array direction are discretely disposed to vary a density of the emitter region.

12. The semiconductor apparatus according to claim 4, wherein the emitter regions in an extending direction which is perpendicular to the array direction are discretely disposed to vary a density of the emitter region.

13. The semiconductor apparatus according to claim 1, wherein a density of the emitter region is varied based on a distance between a connection point of each wire and an end of the semiconductor apparatus.

14. The semiconductor apparatus according to claim 2, wherein a density of the emitter region is varied based on a distance between a connection point of each wire and an end of the semiconductor apparatus.

15. The semiconductor apparatus according to claim 3, wherein a density of the emitter region is varied based on a distance between a connection point of each wire and an end of the semiconductor apparatus.

16. The semiconductor apparatus according to claim 4, wherein a density of the emitter region is varied based on a distance between a connection point of each wire and an end of the semiconductor apparatus.

17. The semiconductor apparatus according to claim 1 comprising:
- a plurality of gate metal layers provided extending in an extending direction which is perpendicular to the array direction on the upper surface of the semiconductor substrate; and
- a contact region of a first conductivity type provided between two of the plurality of gate metal layers,
- wherein the contact regions are discretely disposed in the extending direction.

18. The semiconductor apparatus according to claim 2 comprising:
- a plurality of gate metal layers provided extending in an extending direction which is perpendicular to the array direction on the upper surface of the semiconductor substrate; and
- a contact region of a first conductivity type provided between two of the plurality of gate metal layers,
- wherein the contact regions are discretely disposed in the extending direction.

19. The semiconductor apparatus according to claim 3 comprising:
- a plurality of gate metal layers provided extending in an extending direction which is perpendicular to the array direction on the upper surface of the semiconductor substrate; and
- a contact region of a first conductivity type provided between two of the plurality of gate metal layers,
- wherein the contact regions are discretely disposed in the extending direction.

20. The semiconductor apparatus according to claim 17, wherein the contact region is sandwiched between the emitter regions in the extending direction.

* * * * *